United States Patent
Feichtinger et al.

(10) Patent No.: US 9,196,402 B2
(45) Date of Patent: Nov. 24, 2015

(54) ELECTRONIC COMPONENT ASSEMBLY COMPRISING A VARISTOR AND A SEMICONDUCTOR COMPONENT

(75) Inventors: Thomas Feichtinger, Graz (AT); Guenter Engel, Leibnitz (AT); Axel Pecina, St. Martin (AT)

(73) Assignee: EPCOS AG, Munich (DE)

( * ) Notice: Subject to any disclaimer, the term of this patent is extended or adjusted under 35 U.S.C. 154(b) by 297 days.

(21) Appl. No.: 12/994,143

(22) PCT Filed: May 22, 2009

(86) PCT No.: PCT/EP2009/056251
§ 371 (c)(1),
(2), (4) Date: Mar. 14, 2011

(87) PCT Pub. No.: WO2009/141439
PCT Pub. Date: Nov. 26, 2009

(65) Prior Publication Data
US 2011/0261536 A1 Oct. 27, 2011

(30) Foreign Application Priority Data
May 21, 2008 (DE) .......................... 10 2008 024 480

(51) Int. Cl.
| H05K 1/03 | (2006.01) |
| H01C 1/084 | (2006.01) |
| H01C 7/10 | (2006.01) |
| H01C 7/12 | (2006.01) |
| H05K 1/18 | (2006.01) |
| H05K 1/02 | (2006.01) |

(52) U.S. Cl.
CPC .................. *H01C 1/084* (2013.01); *H01C 7/10* (2013.01); *H01C 7/12* (2013.01); *H05K 1/181* (2013.01); *H01L 2224/48091* (2013.01); *H05K 1/0203* (2013.01); *H05K 2201/10022* (2013.01); *H05K 2201/1053* (2013.01); *H05K 2201/10106* (2013.01); *H05K 2201/10515* (2013.01); *H05K 2201/10674* (2013.01)

(58) Field of Classification Search
CPC .......... H01L 2924/01078; H01L 2924/01074; H01C 7/102; H01C 7/105
USPC .......... 174/252, 256, 262; 361/713, 704, 707
See application file for complete search history.

(56) References Cited

U.S. PATENT DOCUMENTS

| 3,766,098 | A | * | 10/1973 | Masuyama et al. ........ 252/519.5 |
| 3,928,242 | A | | 12/1975 | May |
| 5,796,568 | A | * | 8/1998 | Baiatu ........................... 361/106 |
| 6,469,611 | B1 | * | 10/2002 | Kluge-Weiss et al. .......... 338/20 |
| 6,679,996 | B1 | * | 1/2004 | Yao ................................... 216/40 |
| 7,696,856 | B2 | | 4/2010 | Saito et al. |

(Continued)

FOREIGN PATENT DOCUMENTS

| DE | 10 2007 013 016 | 10/2007 |
| EP | 1 580 809 | 9/2005 |

(Continued)

*Primary Examiner* — Jinhee Lee
*Assistant Examiner* — James Wu
(74) *Attorney, Agent, or Firm* — Cozen O'Connor

(57) ABSTRACT

An electric component assembly comprising a semiconductor component (1) and a carrier is specified, wherein the carrier contains a highly thermally conductive ceramic and is connected to a varistor body. Heat from the semiconductor component can be at least partially dissipated to the carrier (3) by means of the varistor body.

16 Claims, 2 Drawing Sheets

(56) References Cited

U.S. PATENT DOCUMENTS

| | | | |
|---|---|---|---|
| 2005/0184387 A1* | 8/2005 | Collins et al. | 257/712 |
| 2007/0075323 A1* | 4/2007 | Kanazawa et al. | 257/98 |
| 2007/0297108 A1* | 12/2007 | Collins et al. | 361/56 |
| 2009/0256669 A1* | 10/2009 | Kosowsky et al. | 338/21 |

FOREIGN PATENT DOCUMENTS

| | | | | |
|---|---|---|---|---|
| EP | 1 858 033 | 3/2006 | | |
| JP | 05 072567 | 3/1993 | | |
| JP | 08-191155 | 7/1996 | | |
| JP | 2002-151741 | 5/2002 | | |
| JP | 2005-244220 | 9/2005 | | |
| JP | 2005276938 A | * 10/2005 | | H01C 7/10 |
| JP | 2007-103505 | 4/2007 | | |
| JP | 2007-250899 | 9/2007 | | |
| JP | 2008 028029 | 2/2008 | | |
| JP | 2008-028029 | 2/2008 | | |
| JP | 4867511 | 2/2012 | | |
| KR | 10 2006 0031648 | 4/2006 | | |
| TW | 229948 | 3/2005 | | |
| WO | WO 2005/001943 | 1/2005 | | |

* cited by examiner

ELECTRONIC COMPONENT ASSEMBLY COMPRISING A VARISTOR AND A SEMICONDUCTOR COMPONENT

RELATED APPLICATIONS

This is a U.S. national stage of application No. PCT/EP2009/056251, filed on May 22, 2009.

This application claims the priority of German application no. 10 2008 024 480.5 filed May 21, 2008, the entire content of which is hereby incorporated by reference.

FIELD OF THE INVENTION

An electric component assembly comprising heat-dissipating means for a semiconductor component is described.

BACKGROUND OF THE INVENTION

DE 10 2007 013 016 A1 discloses a varistor component with heat conductors. According to one embodiment, a light-emitting diode is arranged on the varistor component.

SUMMARY OF THE INVENTION

One object to be achieved is to provide heat-dissipating means for an electric component in an assembly.

An electric component assembly comprising a semiconductor component and a carrier is specified, wherein the carrier contains a highly thermally conductive ceramic and is connected to at least one varistor body. In this case, heat from the semiconductor component can be at least partially dissipated to the carrier by means of the varistor body. The carrier is also referred to hereinafter as heat sink.

The following have proved to be highly thermally conductive ceramics of the heat sink, for example: aluminum nitride, silicon carbide, hafnium oxide and manganese oxide, which are correspondingly preferably contained in the heat sink. A highly thermally conductive ceramic of the heat sink can be formed as a matrix that takes up a highly thermally conductive filler, such as metal, for example. Thus, according to one embodiment, metal particles are contained as filler in the already highly thermally conductive ceramic matrix of the heat sink. This measure increases the total thermal conductivity of the heat sink even further.

Furthermore, the heat sink can have at least one thermally conductive channel having a material constitution that differs from the surrounding material of the carrier. In particular, it is preferred for the thermally conductive channel to have a higher thermal conductivity than the surrounding material. In this case, the thermally conductive channel can contain a metal or a highly thermally conductive ceramic.

According to one embodiment, the heat sink is embodied as a plate or as a rigid support.

In accordance with one embodiment, the heat sink has a plurality of electrical terminals serving for making contact with a component connected to the heat sink, such as, for example, the semiconductor component or the varistor body. According to one embodiment, the electrical terminals are embodied as electrically conductive layers. By way of example, according to one embodiment, electrical conductor tracks are arranged on the heat sink. These can in each case have courses with multiple changes in direction or be realized as planar, geometrical patterns. They can be applied to the heat sink by means of screen printing. If the heat sink is embodied as a plate or as a rigid support, then the electrical terminals can be arranged on mutually opposite surfaces of the plate. The plurality of electrical terminals of the heat sink preferably comprise anodes, cathodes and/or ground contacts, wherein, according to one embodiment, a ground contact of the heat sink is contact-connected to that of the varistor body. Anode and cathode contacts of the heat sink can make contact with corresponding contacts of the varistor body or of the semiconductor component.

According to one embodiment, the semiconductor component has, on its underside lying on the heat sink, external electrical contacts that are contact-connected to the electrical terminals of the heat sink. In this case, it is preferred for the external electrical contacts of the semiconductor component to be embodied as solder balls, in particular as flip-chip contact-connection. Such external electrical contacts considerably facilitate the mounting of the semiconductor component on the heat sink.

According to one advantageous embodiment, the heat sink has electrical plated-through holes which, by way of example, are connected to conductor track structures applied, if appropriate, on the heat sink. Thus, an electrical contact-connection of the semiconductor component and/or of the varistor body can be led through the heat sink to a printed circuit board, for example.

The heat sink can comprise a plurality of layers which are arranged one above another and between which run conductor tracks, for example, which could be connected to plated-through holes of the heat sink. The layers can be dielectric layers, in particular highly thermally conductor ceramic layers. The layers can be sintered to one another, a monolithic ceramic plate being formed.

In accordance with one embodiment of the electric component assembly, the varistor body is embodied as a component and mounted on the heat sink, wherein the semiconductor component, for its part, is mounted on the varistor body.

The varistor body preferably contains a composite material composed at least of a varistor ceramic and a highly thermally conductive material, wherein the highly thermally conductive material differs from the varistor ceramic, which is principally chosen for the nonlinear resistance function of the varistor body. Suitable formulations for a varistor ceramic formed as matrix are, for example, the compounds zinc oxide-bismuth-antimony or zinc oxide-praseodymium.

In accordance with one embodiment, the varistor ceramic is formed as main component or as matrix of the composite material and the thermally conductive material is formed as filler in said matrix. One example of a highly thermally conductive filler is a metal.

The filler is preferably present as a distribution of highly thermally conductive particles in the varistor body. Suitable metals that may be mentioned include, in particular, metals having a thermal conductivity of greater than 100 W/(m*K) and/or noble metals of the 2nd and 3rd transition metal periods or the alloys thereof. The metal present as filler is preferably chosen from silver (Ag), palladium (Pd), platinum (Pt), tungsten (W), alloys of said elements or mixtures of the aforementioned substances. Appropriate alloys include alloys of the stated metals among one another and/or with other elements; silver-palladium alloys may be mentioned by way of example.

A metal preferably present as filler in the varistor ceramic has the advantage of imparting a higher thermal conductivity to the varistor body, such that heat can be dissipated to the heat sink by the varistor body itself. Heat passing by way of the electrical terminals between the semiconductor component and the varistor body can also be dissipated to the heat sink by means of the varistor body embodied in particularly thermally conductive fashion.

In one advantageous embodiment, the varistor body contains a highly thermally conductive ceramic that differs from the varistor ceramic or has a higher thermal conductivity than the varistor ceramic. Suitable ceramics have proved to be, for example, aluminum nitride, silicon carbide, hafnium oxide and manganese oxide, in particular also because they can be sintered well with a preferred varistor ceramic such as zinc oxide, for example, without undesirable crystalline interruptions forming in the varistor body. The additional, highly thermally conductive ceramic can be present, in a manner similar to that in the case of the metal, as filler in the varistor ceramic embodied as matrix.

The filler in the varistor body is present, for example, as a distribution of highly thermally conductive particles which is preferably as homogeneous as possible.

The varistor body can be embodied as a multilayer varistor comprising a stack of varistor ceramic layers and internal electrode layers lying therebetween at least in regions. It is preferred for the multilayer varistor to be a sintered, monolithic multilayer component. In terms of principal proportion zinc oxide is preferably chosen as varistor ceramic of the individual layers, wherein the internal electrodes can contain silver, palladium, platinum, copper, nickel or an alloy of these materials.

According to one embodiment, one or a plurality of layers of a varistor body embodied as a multilayer varistor can comprise zirconium oxide. In this case, it is preferred for at least the base layer of the multilayer varistor, said base layer lying on the ceramic heat sink, to contain zirconium oxide. It is thereby possible to reduce the influences of stray capacitances of the multilayer varistor on the ceramic heat sink and the conductor tracks present, if appropriate, on the ceramic heat sink. The top layer of the multilayer varistor could also be embodied as a layer containing zirconium oxide. That could be advantageous if a further component is arranged on the varistor body, said further component being intended to remain undisturbed by stray capacitances.

Instead of any multilayer varistor, the varistor body can be embodied as a bulk varistor. The latter has a single varistor block, at the outer side of which external contacts of opposite polarities are present. Internally, however, the varistor block is free of metallic layers.

In accordance with one embodiment, the varistor body has a plurality of electrical terminals, at least one first electrical terminal of which makes contact with the semiconductor component. Said electrical terminal is preferably embodied as a metallic layer on the varistor body. The metallic layer can be applied on at least one region of the top side of the varistor body, for example by means of screen printing. The electrical terminals are preferably bondable.

The plurality of electrical terminals can be connected to a contact wire and/or to a conductor track on the heat sink.

In accordance with one embodiment of the component assembly, the plurality of electrical terminals of the varistor body comprise at least one second electrical terminal which is separate from the first electrical terminal and which makes contact with the varistor body toward the outside, which means that the varistor body is connected to a second electrical potential, isolated from the semiconductor component, by said second electrical terminal. A second electrical terminal can be a ground terminal, for example. In this case, the second electrical terminal can be contact-connected to a conductor track on a printed circuit board.

Both a first electrical terminal and a second electrical terminal can be embodied as metallic layers. Electrical terminals of the varistor body which are embodied as metallic layers can contain at least one of the following materials: gold, nickel, chromium, palladium, tin.

In accordance with one embodiment of the component assembly, the second electrical terminal, which makes contact with the varistor body toward the outside, is arranged on the underside of the varistor body, that is to say on the area lying perpendicularly opposite the mounting area of the semiconductor component. The second electrical terminal can be embodied as a bonding pad, for example.

One embodiment provides for the second electrical terminal to be arranged in a manner spaced apart from the first electrical terminal on the top side of the varistor body. In this case, the two terminals could comprise contact wires that connect the varistor body to the semiconductor component and to ground.

One embodiment provides for the first electrical terminal of the varistor body, which makes contact with the semiconductor component, simultaneously to form a contact of the varistor body toward the outside, if appropriate using a contact wire used with the first electrical terminal.

In accordance with one embodiment, the varistor body has at least one internal electrode that can serve for tuning the capacitance of the varistor body. The internal electrode can be arranged between the layers of a layer stack of the varistor body. The internal electrode can be a ground electrode that dissipates overvoltages or surge currents through the varistor or from the varistor body. The internal electrode is connected to at least one electrical terminal of the varistor body—a mechanical contact-connection is not absolutely necessary in this case, however. The internal electrode could therefore be arranged in "floating" fashion within the varistor body. Alternatively, the internal electrode is connected to the at least one electrical terminal by means of at least one plated-through hole, which can also be designated as via.

In accordance with one embodiment, a plurality of internal electrodes are present in the varistor body and make contact with different electrical terminals of the varistor body. The internal electrodes can be embodied in floating fashion or in a manner contact-connected toward the outside. It is preferred for said electrodes to be isolated from one another by means of a varistor ceramic or by means of a dielectric and to have common overlap areas in the stacking direction, by means of which capacitances can be produced. In accordance with one embodiment, the internal electrodes run perpendicularly to the mounting area of the semiconductor component. In this case, the varistor body can lie with a longitudinal side on the heat sink, that is to say that the stacking direction of the varistor body runs parallel to the plane of the heat sink or to the mounting plane of a semiconductor component mounted on the varistor body.

Internal electrodes of the varistor body that are contact-connected to one common electrical terminal can in each case lie on the same plane as internal electrodes contact-connected to another common electrical terminal of the varistor body. Capacitances between the internal electrodes are in this case produced between the mutually facing ends of internal electrodes which are present on the same plane in the varistor body. Internal electrodes of opposite polarities do not overlap in orthogonal projection in such an embodiment.

In accordance with one embodiment of the component assembly, the semiconductor component is mounted on the heat sink. In this case, it is preferred for said component to have, on its underside lying on the heat sink, external electrical contacts that are contact-connected to electrical conductor tracks on the heat sink. It is preferred for said external electrical contacts of the semiconductor component to be embodied as solder balls, in particular as flip-chip contact-connection. Such external electrical contacts facilitate the mounting of the semiconductor component on the heat sink.

In an embodiment of the component assembly wherein the semiconductor component is mounted on the heat sink, the varistor body can be integrated in the heat sink. As a result of the integration of the varistor body in the heat sink, the varistor body is connected to the heat sink, both mechanically and thermally, if appropriate also electrically, provided that the varistor body is connected to electrical terminals of the heat sink. A highly compact arrangement of a heat sink, a varistor body and a semiconductor component is thus afforded.

In this case, the varistor body integrated in the heat sink is preferably connected to a first and to a second electrical terminal, wherein these terminals can be arranged for example on mutually opposite surfaces of the heat sink. In this case, the first electrical terminal can be an electrical terminal with respect to the semiconductor component and the second electrical terminal can be a ground terminal. The varistor body can be embodied as a via in the heat sink. In this case, it can run from a surface facing the semiconductor component to the opposite surface. A plurality of such so-called varistor vias can be integrated in the heat sink. A varistor via can be embodied as a hole that is filled with a varistor material in the heat sink.

In accordance with one embodiment, a further component, for example a thermistor, is arranged on the heat sink laterally alongside the semiconductor component, which further component can be contact-connected by means of electrical terminals of the heat sink. The further component can be a semiconductor component of the type described in this document or some other electric component. In any event, the heat sink is able to dissipate heat from all components arranged on the heat sink. If a varistor body is also contact-connected to the further component, then the further component can furthermore be protected against overvoltages.

Preference is given to a component assembly comprising a housing, in or at which the heat sink is arranged. It is preferred for the housing to have at least one electrically conductive part or region which is contact-connected to the varistor body and/or to the semiconductor component. The housing carries the heat sink, wherein the semiconductor component and the varistor body are connected in parallel with the electrically conductive part of the housing. The electrically conductive part of the housing can be embodied specifically as a metallic layer, for example as a conductor track. The electrically conductive part of the housing preferably contains aluminum or copper.

According to one embodiment, the housing has a plurality of electrically conductive regions which are electrically decoupled from one another by means of an insulation and which are contact-connected to electrical terminals—of identical polarity—of the semiconductor component, of the varistor body and/or of the heat sink.

In accordance with one embodiment, the housing has at least one thermally conductive region which is thermally coupled to the carrier and/or to the varistor body. As a result, heat taken up by the varistor body and/or by the carrier can be dissipated through the housing. In this case, this thermally conductive region of the housing can comprise a highly thermally conductive material such as, for example, a highly thermally conductive ceramic or a metal.

In accordance with one expedient embodiment of the component assembly, it additionally comprises a thermistor connected to the semiconductor component. In a manner dependent on its resistance/temperature characteristic curve, the thermistor contributes to the regulation of the control current of the semiconductor component, such that it can be operated with safeguarding care. In accordance with one embodiment, the thermistor is mounted on the varistor body, but need not be so mounted. Instead, it could be arranged on the carrier or on the heat sink alongside the semiconductor component or separately from the carrier in a common housing.

The semiconductor component can be chosen from a large number of components. It can be an optoelectronic component, such as e.g. an LED, a capacitor or a multilayer capacitor, a thermistor or a multilayer thermistor having PTC or NTC properties, a diode or an amplifier. At all events the varistor body is able to protect the semiconductor component that is contact-connected to it against overvoltages with safeguarding care, and is even able, according to some embodiments described in this document, to dissipate heat from the semiconductor component. Moreover, a heat sink that can dissipate heat from the semiconductor component is always present.

An LED as semiconductor component is preferably composed of one or more of the following materials: gallium phosphide (GaP), gallium nitride (GaN), gallium arsenic phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium indium nitride (AlGaInN), tin selenide (ZnSe).

The component assembly comprising the ceramic heat sink has the advantage of being industrially applicable as an individual product.

BRIEF DESCRIPTION OF THE DRAWINGS

The subjects described will be explained in greater detail with reference to the following figures and exemplary embodiments.

In the figures.

DETAILED DESCRIPTION OF THE DRAWINGS

Figure 1:
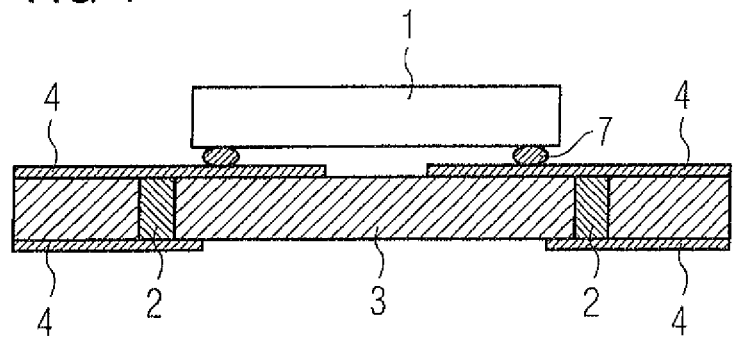
FIG. 1 shows a cross-sectional view of a component assembly with a semiconductor component mounted on a heat sink.

FIG. 1 shows an optoelectronic component assembly wherein a semiconductor component 1, such as an LED, for example, is arranged on a heat sink 3 embodied as a carrier. An electrical contact between the heat sink 3 and the semiconductor component 1 is achieved by means of a flip-chip contact-connection 5 situated on the underside of the LED and by means of electrical terminals 4 of the top side of the heat sink 3. The electrical terminals 4 are spaced apart from one another on the top side of the heat sink and are in each case embodied for example as a contact pad or as a metallic layer. A solder ball of the flip-chip contact-connection 5 of the semiconductor component 1 can be arranged on each electrical contact 4 of the top side of the heat sink 3.

The heat sink 3 itself is embodied as a ceramic plate. The latter is provided on the top side and underside with metallic layers 4 spaced apart from one another, for example in the form of conductor tracks, in order, with separate electrical poles, to make contact with a semiconductor component arranged on the heat sink. The metallic layers 4 contain aluminum, for example.

The electrical terminals 4 applied on mutually opposite surfaces of the highly thermally conductive ceramic plate 3, which contains aluminum nitride, for example, are connected to one another by means of a respective varistor via 2 integrated in the plate 3. The respective varistor via contains, for example, zinc oxide as matrix and can be enriched with a thermally conductive ceramic and/or with a metal, in each case as filler, as a result of which the thermal conductivity of the varistor body is increased.

Electrical terminals 4 arranged on the underside of the heat sink can be ground terminals that contact-connect the respective varistor vias 3 to ground. Electrical terminals of the heat sink 3 that are on the top side and are contact-connected to the semiconductor component can be embodied as anodes and/or cathode contacts.

Figure 2:
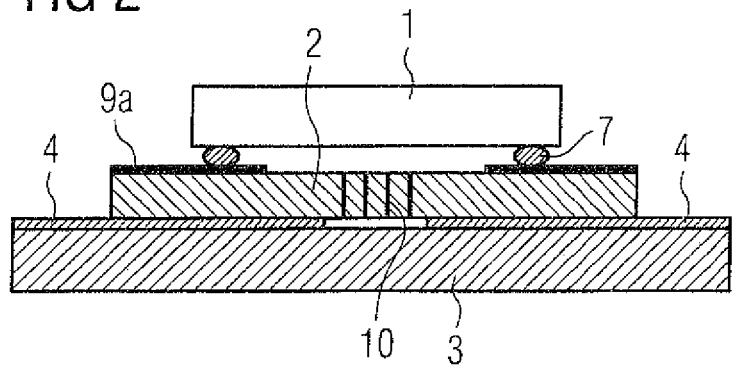
FIG. 2 shows a cross-sectional view of a component assembly with a semiconductor component mounted on a heat sink and a varistor chip arranged between them.

FIG. 2 shows an optoelectronic component assembly wherein a varistor body 2 embodied as a chip is arranged onto electrical contacts 4 of the ceramic plate 3 that are on the top side. As in the case of the LED shown in FIG. 1, the varistor chip 2 can have on the underside a flip-chip contact-connection (not shown) that makes contact with the metallic layers 4 of the heat sink. On the top side, the varistor chip 2, for its part, is provided with electrical terminals 9a in the form of metallic layers that make contact with the electrical terminals 5 on the underside of the LED 1 mounted on the varistor chip 2. Said terminals can be anodes or cathode terminals. The varistor chip 2 can be embodied as a bulk varistor, wherein it comprises a one-piece basic body (without layers) composed of a varistor ceramic and optionally further additions of the type described in this document for improved thermal conductivity. The varistor body is equipped with thermally conductive channels 10 (although the latter are optional) that run perpendicularly to the mounting area of the LED 1 through the interior of said varistor body. The thermally conductive channels 10 can be embodied as holes filled with metal or as a hole filled with a highly thermally conductive ceramic, wherein said thermally conductive ceramic has a higher thermal conductivity than that of the surrounding varistor ceramic.

Figure 3:
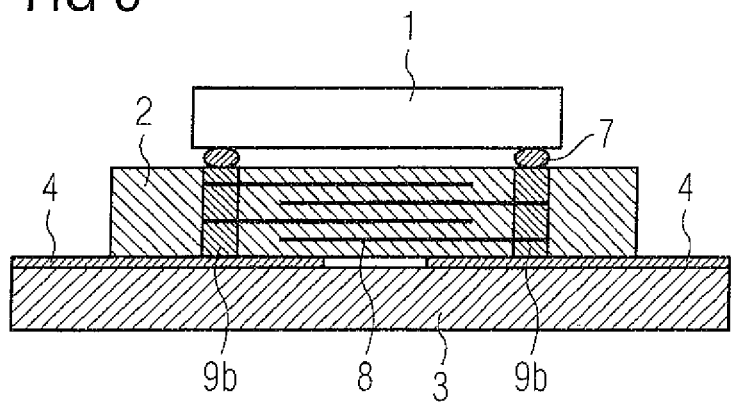
FIG. 3 shows a component assembly in accordance with FIG. 2, with one possible configuration of the internal part of the varistor chip.

FIG. 3 shows an assembly of components in accordance with FIG. 2 with the difference that the varistor body 2 is embodied as a monolithically sintered multilayer varistor comprising a stack of laminated ceramic and electrode layers or internal electrodes 8. The internal electrodes 8 of each internal electrode set, that is to say of each set of internal electrodes of identical polarity, make contact respectively with a plated-through hole 9b that is common to these internal electrodes and is integrated in the multilayer varistor 2. The plated-through hole 9b runs from the top side of the multilayer varistor 2 to the underside and forms, on each surface of the multilayer varistor, an electrical terminal area that can be contact-connected to a further component or to an electrical terminal. By way of example, a solder ball of a flip-chip contact-connection 7 of the LED 1 is seated directly on the exposed end area of the plated-through hole 9b of the varistor body. At the underside of the varistor body 2, an end area of the plated-through hole 9b is seated on a metallic layer 4 applied on the ceramic plate 3. Consequently, the plated-through hole 9b can also serve as an external contact of the varistor body 2.

Figure 4:
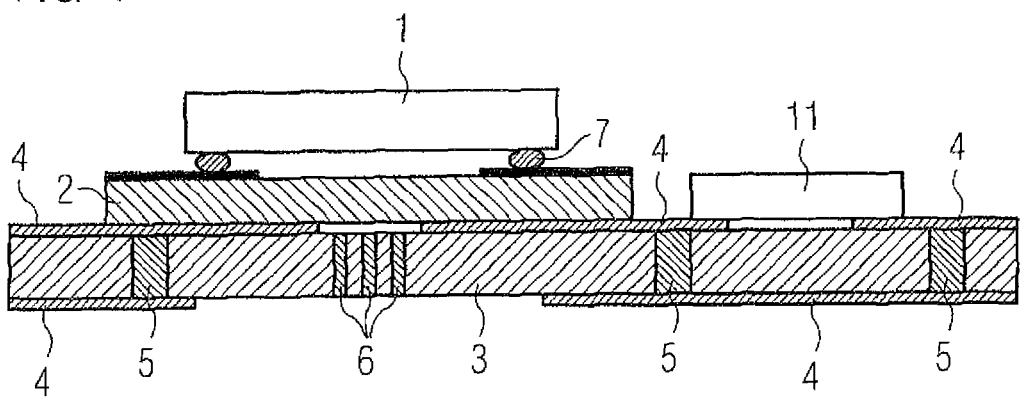
FIG. 4 shows a component assembly in accordance with FIG. 2 with one possible configuration of the internal part of the heat sink, and also with an additional component mounted on the heat sink.

FIG. 4 shows an optoelectronic component assembly wherein a varistor chip 2, on which an LED is mounted, is mounted on a highly thermally conductive ceramic plate 3.

Alongside the varistor chip, a further component 11, for example a thermistor, is arranged at a distance on the ceramic plate 3. The thermistor 11 and the varistor chip 2 are contact-connected in part to the same electrical terminal 4 of the top side of the ceramic plate 3, said electrical terminal being embodied as a metallic layer. The thermistor can likewise have a flip-chip contact-connection on the underside. The thermistor is used, in a manner dependent on its temperature and resistance characteristic curve, to regulate the control current of the LED or of the semiconductor component. In this case, the thermistor can be connected to an evaluation unit, which uses measured values of the thermistor in order to regulate the current that feeds the semiconductor component. The control current is regulated in such a way that the LED is not subjected to any surge currents or is operated with as far as possible constant alternating current.

The thermally conductive ceramic plate 3 has a plurality of electrical plated-through holes 5 that make contact with electrical terminals 4 applied on opposite surfaces of the ceramic plate 3. There are also present in the ceramic plate 3 perpendicularly to the bearing area of the varistor chip 2 a plurality of thermal vias in the form of thermally conductive channels 6 that likewise run perpendicularly to the bearing area of the varistor chip 2 on the ceramic plate 3. A thermal via 6 can be embodied as a hole in the ceramic plate that is filled with a metal or with a highly thermally conductive ceramic.

Figure 5:
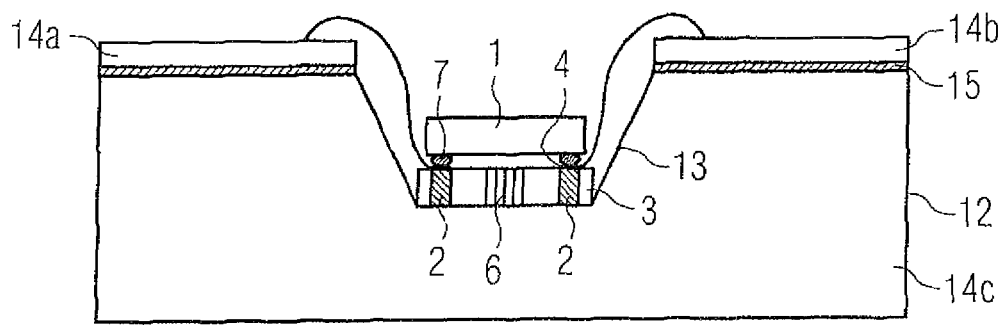
FIG. 5 shows a component assembly with a semiconductor component mounted on a heat sink, and also with a housing.

FIG. 5 shows an optoelectronic component assembly comprising a highly thermally conductive ceramic plate 3 as a carrier of an LED 1, wherein the carrier 3 is connected to a varistor body 2, which is integrated as a varistor via in the carrier. The component assembly has a housing 12, in the depression 13 of which the ceramic plate 3 bears on a base. The semiconductor component 1, the varistor body 2 and also the ceramic heat sink 3 can be embodied, with regard to their arrangement and also with regard to their respective construction, according to one of the type described in this document.

The depression 13 of the housing 12 preferably has a reflective coating on its surface exposed to the light from the LED. The entire coupling-out of light from the component assembly can thereby be increased. Electrical terminals on the underside of the ceramic plate 3, as are also shown in detail by FIG. 1, are contact-connected to a corresponding electrical terminal 14c of the housing 12, which is a ground terminal, for example. The ground terminal 14c is electrically decoupled from a cathode terminal 14b and from an anode terminal 14a of the housing 12 by means of an insulation 15, for example an insulating layer integrated in the housing. The anode terminal 14a and the cathode terminal 14b of the housing 12 can be connected to the corresponding terminals of the semiconductor component 1 and of the varistor body 2 by means of contact wires, for example. That region of the housing 12 which serves as ground terminal 14c or is contact-connected to the varistor body 2 can consist, for example, of a metal such as e.g. copper or aluminum. In particular, a metal is preferred which is electrically conductive with low resistance and has a high reflectivity for improved coupling-out of light.

Preferably, the heat sink 3 is mechanically connected to a highly thermally conductive region of the housing 12, but at all events is thermally coupled to it in order that the housing can dissipate heat taken up by the heat sink, said heat originating from or being emitted by the varistor body 2 and/or by the semiconductor component 1, further toward the outside.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An electric component assembly, comprising a semiconductor component and a carrier, said carrier containing a thermally conductive ceramic and being connected to at least one varistor body, wherein heat from the semiconductor component can be at least partially dissipated to the carrier of the varistor body, wherein the varistor body contains a composite material composed at least of a varistor ceramic as matrix and a thermally conductive material as filler, wherein the thermally conductive material differs from the varistor ceramic, wherein the filler is present as a homogenous distribution of highly thermally conductive particles in the varistor body, and wherein the filler is highly thermally conductive ceramics selected from the group consisting of hafnium oxide and manganese oxide.

2. The electric component assembly as claimed in claim 1, wherein the carrier contains at least one material selected from: aluminum nitride, silicon carbide, hafnium oxide, manganese oxide.

3. The electric component assembly as claimed in claim 1, wherein the carrier has at least one thermally conductive channel having a material constitution that differs from the surrounding material of the carrier.

4. The electric component assembly as claimed in claim 1, wherein the varistor body is mounted on the carrier, wherein the semiconductor component, for its part, is mounted on the varistor body.

5. The electric component assembly as claimed in claim 4, wherein the varistor body is embodied as a multilayer varistor.

6. The electric component assembly as claimed in claim 4, wherein the varistor body comprises at least one thermally conductive channel through which heat from the semiconductor component can be dissipated to the carrier.

7. The electric component assembly as claimed in claim 1, wherein the varistor body is integrated in the carrier.

8. The electric component assembly as claimed in claim 1, wherein the carrier has a plurality of electrical terminals, wherein at least one first electrical terminal produces an electrical connection to the semiconductor component and at least one second electrical terminal produces an electrical connection toward the outside.

9. The electric component assembly as claimed in claim 8, wherein the varistor body is integrated in the carrier and is connected to the first and the second electrical terminal of the carrier.

10. The electric component assembly as claimed in claim 9, wherein the varistor body is embodied as a via.

11. The electric component assembly as claimed in claim 1, wherein the varistor body has at least one internal electrode.

12. The electric component assembly as claimed in claim 1, wherein the carrier is integrated in a housing, wherein the housing has a thermally conductive region which is connected to the carrier and which is thermally coupled to the carrier.

13. The electric component assembly as claimed in claim 1, wherein the semiconductor component is selected from the components:
optoelectronic component, LED, capacitor, multilayer capacitor, thermistor, multilayer thermistor, diode, amplifier.

14. The electric component assembly as claimed in claim 1, additionally comprising a thermistor which contributes, in a manner dependent on its resistance/temperature characteristic curve, to the regulation of the control current of the semiconductor component.

15. The electric component assembly as claimed in claim 1, wherein the highly thermally conductive ceramics is hafnium oxide.

16. The electric component assembly as claimed in claim 1, wherein the highly thermally conductive ceramics is manganese oxide.

* * * * *